United States Patent [19]

Chiang et al.

[11] Patent Number: 5,317,069
[45] Date of Patent: May 31, 1994

[54] MALEIMIDE-ALT-SILYLSTYRENE COPOLYMER

[75] Inventors: Wen-Yen Chiang; Jin-Yuh Lu, both of Taipei, Taiwan

[73] Assignee: National Science Council, Taipei, Taiwan

[21] Appl. No.: 73,133

[22] Filed: Jun. 7, 1993

[51] Int. Cl.$^5$ .............................................. C08F 22/40
[52] U.S. Cl. ................................... 526/262; 526/279; 528/322
[58] Field of Search ................. 526/262, 279; 528/322

[56] References Cited

U.S. PATENT DOCUMENTS 5,182,351 1/1993 Shiobara et al. .................. 526/262

OTHER PUBLICATIONS

S. Richard Turner et al., "High-Tg Base-Soluble Copolymers as Novolac Replacements for Positive Photoresists" Polymer Engineering and Science, MID-Sep. 1986, vol. 26, No. 16, 1096.
C. E. Osuch, et al., "A New Class of Resins for Deep Ultraviolet Photoresists" SPIE vol. 631 Advances in Resist Technology and Processing III (1986), 68.
R. Sezi, et al., "Silicon Containing Photoresists for Half Micron Lithography" Polymer Engineering and Science, Mid-Jul. 1989, vol. 29, No. 13, 891.
Wen-Yen Chiang et al., "Preparation and Properties of Si-Containing Copolymer for Near-UV Resist 1 Poly (N-(4-Hydroxyphenyl) maleimide-alt-p-Trimethylsilylstyrene)" 1991.
Wen-Yen Chiang et al., "Preparation and Properties of Silicon-Containing Copolymers for near-UV resists, II" Die Angewandte Makromolekulare chemie 205 (1993) 75-90 (No. 3532).
Gary N. Taylor et al., "The Role of Inorganic Material in Dry-Processed Resist Technology" Solid State Technology/Feb. 1984, 145.

Primary Examiner—Harold D. Anderson
Attorney, Agent, or Firm—W. Wayne Liauh

[57] ABSTRACT

The present invention discloses a maleimide-alt-trialkylsilylstyrene copolymer having the formula:

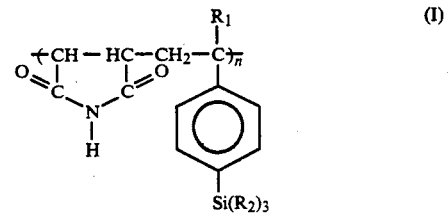

wherein:
R$_1$ is H or methyl;
R$_2$ is C$_1$-C$_3$ alkyl; and
n is an integer such that the copolymer has a weight average molecular weight of 25,000-120,000.

The copolymer of formula (I) is useful in the preparation of a photoresist composition. A process for preparing the copolymer of formula (I) is also disclosed.

4 Claims, 1 Drawing Sheet

MALEIMIDE-ALT-SILYLSTYRENE COPOLYMER

TECHNICAL FIELD OF THE INVENTION

The present invention relates to new and useful Si-containing copolymers and photoresist compositions containing same, in particular, to a maleimide/silylstrene copolymer having a structure of alternating maleimide and silylstyrene units.

BACKGROUND OF THE INVENTION

A typical positive photoresist is a generally two-component material consisting essentially of an alkaline soluble polymer and a radiation-sensitive dissolution inhibitor such as diazonaphthoquinone sulfonate (DNS), wherein the alkaline soluble polymer is rendered insoluble in aqueous alkaline solutions through addition of the radiation-sensitive dissolution inhibitor.

The most widely used positive photoresist is a novolac resin (a condensation polymer of formaldehyde and phenol) containing DNS. To date, several advanced IC manufactures require images that are stable up to 200° C. or even higher. The novolac-based photoresists are unable to perform very well in this temperature range. Thus, some other phenolic polymers have been developed to serve as replacements for the conventional novolace-based photoresists. Example of these phenolic polymers include poly(p-hydroxystyrene) disclosed in U.S. Pat. Nos. 4,139,384 and 4,439,516; poly(p-hydroxy-α-methylstyrene) disclosed by H. Ito, et al, Macromolecules, 16, 513 (1983); and copolymers of N-(4-hydroxyphenyl)maleimide and various olefins disclosed by S. R. Turner, et al, Polym. Eng. Sci., 26, 1096 (1986). In general the alkaline soluble polymers contain carboxylic acids or maleimides as well as phenolic units. For example, poly(p-benzoic acid), disclosed by H. Ito, et al in "Advances in Resist Technology and Processing IV", SPIE, 771, 24 (1987), and maleimide/styrene copolymer, disclosed by C. E. Osuch, et al in "Advances in Resist Technology and Processing III", SPIE, 531, 68 (1986), have been employed to provide positive imaging of high temperature polymers. In addition, a maleimide/allyltrimethylsilane copolymer, disclosed by R. Sezi, et al, Polym. Eng, Sci., 29, 891 (1989), was used as the top imaging layer in a bilayer resist process because of its excellent durability during oxygen-plasma etching.

G. N. Taylor, et al (Solid State Technol., 27, 145 (1984) reported that small amounts of silicon (about 10 wt %) can drastically lower the oxygen-plasma etching rate of organic polymers.

We, in an article entitled "Preparation and Properties of Si-Containing Copolymer for Near-UV Resist. I. Poly(N-(4-hydroxyphenyl)maleimide-alt-p-trimethylsilylstyrene 3", J. Polym. Sci., part A., 29, 399 (1991), and in a pending U.S. application Ser. No. 07/781,616, filed Oct. 23, 1991, disclosed a method to synthesize poly(N-(4-hydroxyphenyl)maleimide-alt-p-trimethylsilylstyrene) (PHTMSS). The co-inventors of the present invention also, in an article entitled "Preparation and properties of silicon-Containing copolymers for Near-UV Resist II", Die Angewandte Makromolekulare Chemie, 205, 75-90 (1993), disclosed a method to synthesize poly(N-(4-hydroxyphenyl)maleimide-alt-p-trimethylsilyl-α-methylstyrene) (α-PHTMMS), and apply them as the top imaging layers. In the α-PHTMMS copolymer so disclosed, the N-(4-hydroxyphenyl)maleimide, which acted as a highly thermally stable unit, and the p-silylstyrene, which acted as an oxygen-plasma etching resistent unit, were alternatingly copolymerized. However, in both disclosures the silicon content of the PHTMSS and a α-PHTMMS copolymer is about 7 wt %.

As a result of an extensive investigation to develop a photoresist which is more thermally stable and more resistant to oxygen-plasma etching than prior art photoresists, a series of novel maleimide/silylstyrene copolymers have been newly synthesized in the present invention.

Accordingly, one object of the present invention is to provide new and useful maleimide/silylstyrene copolymers.

Another object of the present invention is to provide photoresist compositions containing the new maleimide/silylstyrene copolymers.

A further object of the present invention is to provide a process for preparing the new maleimide/silylstyrene copolymers.

SUMMARY OF THE INVENTION

In order to achieve the above-mentioned objects, a maleimide-alt-trialkylsilylstyrene copolymer having the following formula is disclosed:

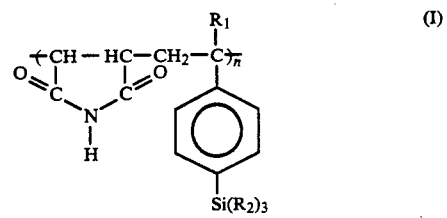

wherein:
R$_1$ is H or methyl;
R$_2$ is C$_1$–C$_3$ alkyl, preferably, methyl; and
n is an integer such that the copolymer has a weight average molecular weight of 25,000–120,000, preferably 30,000–40,000.

In the synthesis of the copolymer of formula (I), p-trialkylsilyl(-α-methyl)styrene is used to replace the allyltrimethylsilane unit of the maleimide/allyltrimethylsilane copolymer disclosed by R. Sezi, et al to enhance the thermal stability. For increasing the silicon content of the copolymer (I), N-(4-hydroxyphenyl)-maleimide units of PHTMSS and α-PHTMMS copolymer disclosed in our pending U.S. Ser. No. 07/781,616 patent application and Die Angewandte Makromolekulare Chemie, 205, 75-90 (1993) are replaced by maleimide.

A photoresist composition is also prepared in the present invention comprising 20:1:100 to 10:10:100 weight ratio of the copolymer of formula (I), diazonaphthoquinone sulfonate, and a solvent.

DETAILED DESCRIPTION OF THE PREFERRED EMBODIMENTS

Figure 1:
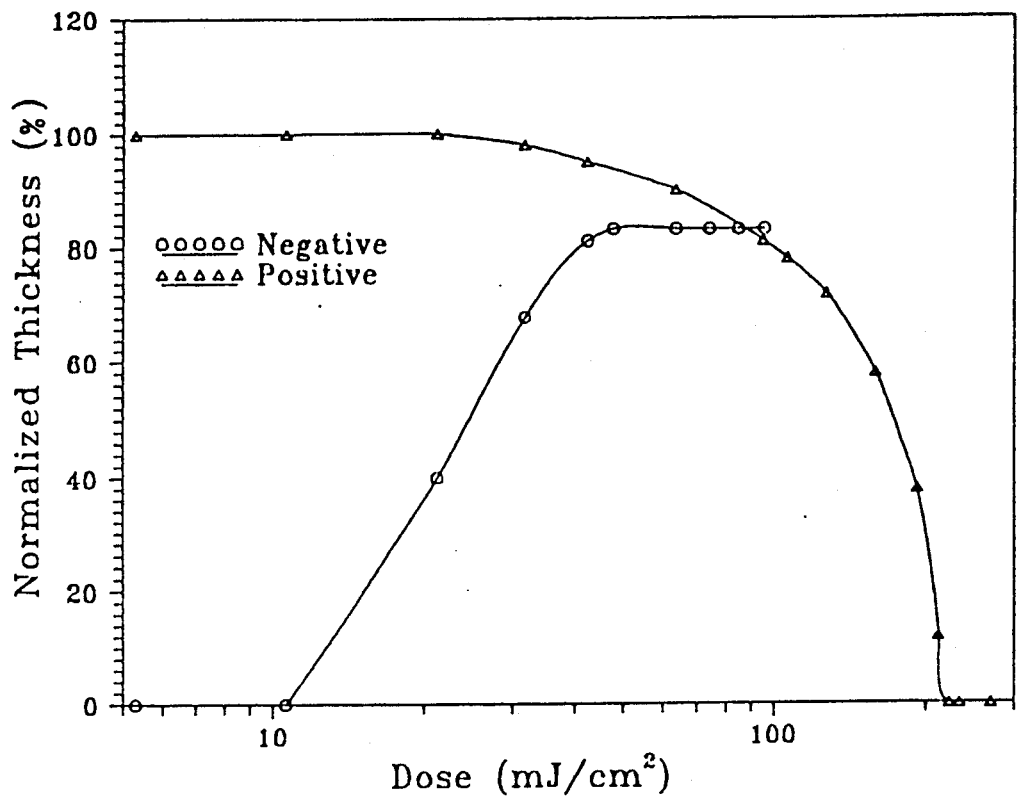
FIG. 1 is a plot which illustrates the exposure responses curves of positive (α-PMTMMS with Bp-t-DNS) and negative (PMTMSS with Bp-t-DNS) resists.

The present invention is related to a maleimide-alt-trialkylsilylstyrene copolymer having the formula:

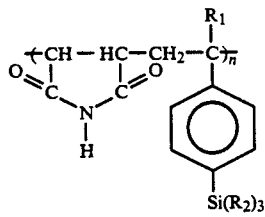

(I)

wherein:

$R_1$ is H or methyl;

$R_2$ is $C_1$–$C_3$ alkyl, preferably, methyl; and n is an integer such that the copolymer has a weight average molecular weight of 25,000–120,000.

Preferably, the copolymer of formula (1) has a weight average molecular weight of 30,000–40,000, and a silicon content of about 10 wt %.

The chain-stiffening effects of the maleimide and the styrene group of the copolymer of formula (I) are responsible for high thermal stabilities, and the silicon content of about 10 wt % thereof renders the copolymer of formula (I) more resistant to an oxygen-plasma etching process.

A process suitable for preparing the copolymer of formula (I) is by solution free-radical copolymerization, which comprises the steps of reacting p-trialkylsilyl(-α-methyl)styrene monomer with equal moles of maleimide monomer in an anhydrous solvent and in the presence of a thermal initiator. An example of suitable anhydrous solvent to be used in the reaction is dry tetrahydrofuran (THF). In general, many conventionally used azo-type initiators, such as 2,2′-azobisisobutyrontirile (AIBN), can be used as the thermal initiator in the reaction. The reaction can be represented by the formula as follows:

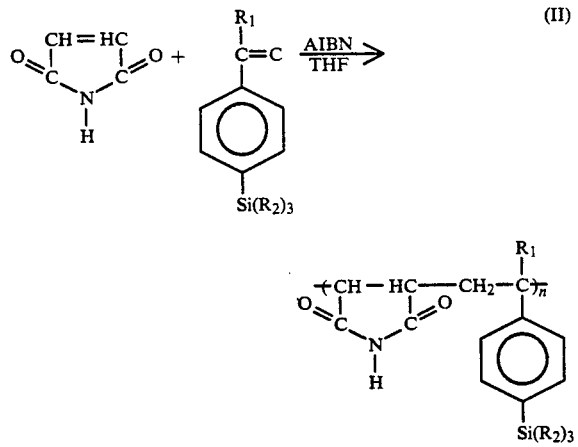

wherein $R_1$ and $R_2$ have the same definitions as in formula (I). The reaction product is isolated by precipitation of the viscous polymer solution into ether, instead of methanol, which was used in our pending U.S. Ser. No. 07/781,616 patent application. Because maleimide monomer shows good solubility in methanol (1:20), the hot viscous polymerization solution is readily soluble in methanol. On the other hand, polysilylstyrene is easily soluble in ether. For this reason, ether is used not only as the precipitator but also as the purification agent of the silicon-containing copolymer of formula (I).

The p-trialkylsilyl(-α-methyl)styrene used in reaction (II) can be prepared by reacting p-chloro(-α-methyl)styrene with magnesium under anhydrous conditions in a donor solvent to form a Grignard reagent, and then adding chlorotrialkylsilane to react with the Grignard reagent. A typical reaction for preparing p-trialkylsilyl(-α-methyl)styrene can be represented by the formula:

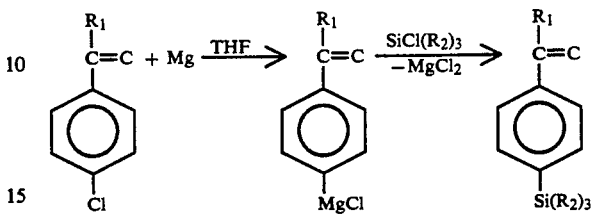

wherein $R_1$ and $R_2$ are defined as in formula (I).

In reaction (II), the electron-rich styreneic monomers tend to undergo alternating copolymerization with electron-poor maleimide monomer. This classic behavior is well documented for similar systems, such as maleimide/styrene, maleimide/allyltrimethylsilane, and N-(4-hydroxyphenyl)maleimide/p-trimethylsilylstyrene copolymers described in the previous section on Background of the Invention. Because the prepared copolymers have alternating structure units, sufficient alkaline solubilities are obtained at 50 mol % maleimide units. Although Y. Ohnishi, et al in "Advances in Resist Technology and Processing II", 539, 62 (1985) report that the solubility of novolac resin in a base solution decreased greatly by introducing trialkylsilyl group, the copolymer of formula (I), which is prepared by introducing trialkylsilyl group into maleimide/(α-methyl)styrene copolymer, is readily soluble in aqueous base solutions such as aqueous sodium hydroxide or tetramethylammonium hydroxide (TMAH). In addition, the copolymer of formula (I) shows good solubility in polar solvents such as dimethylsulfoxide (DMSO), N-methyl-2-pyrrolidone (NMP), dimethylformamide (DMF), dimethylacetamide (DMAc), pyridine, THF and acetone.

The copolymer of formula (I) is useful in preparing a photoresist coating composition. A suitable preparation process comprises the steps of dissolving 10–20 parts by weight of the copolymer, and 1–10 parts by weight of diazonaphthoquinone sulfonate (DNS) as an alkali insoluable sensitizer, in 100 parts by weight of a solvent. Ordinarily, after being exposed to radiation, the DNS would bring about carbene formation. Through the Wolff rearrangement, ketene was formed and then reacted with water to form a base soluble indenecarboxylic acid that no longer inhibited dissolution of the copolymer in an aqueous alkaline solution wash, thereby facilitating development of a positive image.

In the two-component positive photoresist composition, the copolymers are applied as binders for DNS photochemical reaction, positive images should be obtained after the radiation exposure and alkaline bath. However, a negative image is obtained when the copolymer of formula (I) used in the photoresist composition is maleimide-alt-trialkylsilylstyrene, i.e. $R_1$ is H. This unusual phenomenon has also been reported in our previous articles entitled "Preparation and Properties of Si-Containing Copolymer for Near-UV Resist. I. Poly(N-(4-hydroxyphenyl)maleimide-alt-p-trimethylsilylstyrene", J. Polym. Sci., part A., 29, 399 (1991) and "Preparation and properties of silicon-containing copolymers for Near-UV Resist II" Die Angewandte Makromolekulare Chemie, 205, 75-90 (1993), details thereof are incorporated by reference.

Suitable solvents for using in the photoresist coating composition include, but not are limited to, acetone, THF, toluene, xylene, ethyl 2-ethoxyacetate, ethyl 2-methoxyacetate and a mixture of any two solvents thereof.

Particular DNS suitable to be used in the photoresist coating composition are:

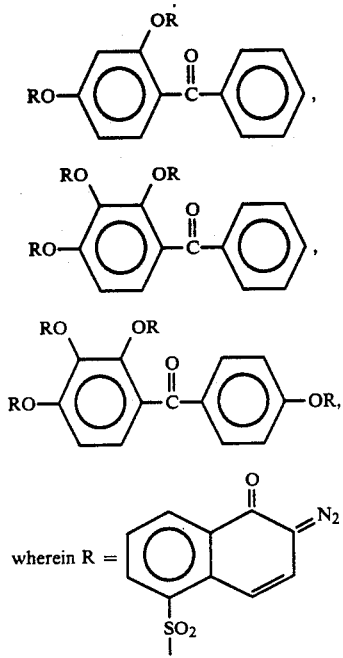

In the following examples two compounds of formula (I) are synthesized and identified, and the properties of the photoresist compositions containing these two compounds are also examined. These examples are only meant to illustrate the present invention not for limiting the scope thereof.

EXAMPLE 1 a) synthesis of para-trimethylsilyl-α-methylstyrene (α-TMMS)

Placing 2 g (83 mmol) of dry magnesium into a 250 mL flask equipped with a condenser, a dropping funnel and a magnetic stirrer, the reaction was carried out in a nitrogen atmosphere. The magnesium was initially activated by adding 1 mL of p-chloro-methylstyrene (Aldrich, Germany) with 0.5 g iodine in 5 mL THF at 50° C. for a period of 30 minutes. Into the mixture a solution of 11 g (72 mmol) of p-chloro-α-methylstyrene in 50 mL THF was dropped over a period of 12 hours under reflux. The reaction mixture was cooled to 40° C., then 7.8 g (72 mmol) of chlorotrimethylsilane (Fluka, Japan) in 30 mL of THF were added dropwise and reacted for 24 hours. After the reaction was completed, a large amount of water was added and the reaction mixture was extracted with ether. The ether layer was dried over magnesium sulfate, and distilled under reduced pressure, bp 66°-67° C./2 mmHg. Yield, 56%. The colorless liquid crude product was purified by column chromatography, which was performed on silica gel using n-hexane as an eluent. The product was identified by IR and $^1$H-NMR spectroscopy.

b) synthesis of para-trimethylsilylstyrene (TMSS)

The procedures of a) were repeated except that the crude product was obtained by distillation at bp 84° C./4.2 mmHg. Yield, 38%.

EXAMPLE 2 a) synthesis of poly(maleimide-alt-p-trimethylsilyl-α-methylstyrene (α-PMTMMS)

Under a nitrogen atmosphere, 50 mL polymerization ampoule was charged with 0.97 g (0.01 mole) of maleimide (Tokyo Kasei Kogyo co., Japan), 1.90 g (0.01 mole) of α-TMMS, 15 mL of dry THF and 0.02 g of azobisisobutyronitrile (AIBN) (Wako, Japan). The ampule was quenched by a dry ice-acetone and sealed. Copolymerization was carried out in a 60° C. bath for 24 hours. The copolymer so obtained was isolated by precipitation of the viscous polymerization solution with ether. After drying under vacuum at 60° C. for 24 hours., 85 wt % of copolymer was obtained. Viscosity, measured in THF at 30° C. with Ubbelohde viscometer, gave intrinsic viscosity $[\eta]=0.85$. GPC analysis in THF gave $\overline{M}w=37,800$; $\overline{M}n=19,300$, and the calculated polydispersity=1.96. Tg=230° C., melting point=312° C.

Anal. Calcd. for $C_{16}H_{21}NO_2Si$ (1:1 structure): C, 66.90%; H, 7.32%; N, 4.88%. Found: C, 66.85%; H, 7.34%; N, 4.84%.

b) synthesis of poly(maleimide-alt-p-trimethylsilylstyrene (PMTMSS)

The procedures of a) synthesis of α-PMTMMS were repeated to obtain PMTMSS. Yield, 92%. The intrinsic viscosity $[\eta]=0.55$, measured in THF at 30° C. with Ubbelohde viscometer. GPC analysis in THF gave $\overline{M}w=31,800$; $\overline{M}n=18,100$, and calculated polydispersity=1.71. Tg=217° C., melting point=275° C.

Anal. Calcd. for $C_{15}H_{19}NO_2Si$ (1:1 structure): C, 65.93%; H, 6.96%; N, 5.13%. Found: C, 65.81%; H, 6.93%; N, 5.12%.

EXAMPLE 3: PHOTORESIST PROCESSING AND PROPERTIES OF THE DEVELOPED IMAGES

Resist solutions were prepared by dissolving 5 wt % of the prepared copolymer, 3 wt % of benzophenone-tridiazonaphoquinone sulfonate (BP-t-DNS) as an alkali insoluble sensitizer, in 92 wt % of THF. The solution were filtered through a 0.5 μm Millipore filter. PH-1 and PH-2 represent the resist solutions prepared by using α-PMTMMS and PMTMSS as the copolymer respectively.

Resists were spin-coated (4000 rpm) on a 4 inch silicon wafers to yield 1.2-1.6 μm film thickness using a spinner (Silicon Valley Group Inc., model SVG-8026). The resist films were prebaked in a conventional oven at 50° C. for 30 min.

Near UV exposures (350-450 nm) were carried out using a Canon Contact Aligner PLA-501F. After exposure, the wafers were soaked in 5 wt % tetramethylammonium hydroxide (HUNT Co., U.S.) for 12 seconds with an agitation developer (SVG-8132) to develop positive images, or continuously rinsed in THF for 15 seconds to develop negative images. The film thickness was measured with a TENCO α-step 200 instrument. The exposure response curves of resists are shown in FIG. 1, which shows that the normalized film thickness of PH-1 resist decrease with increase of the dose that is a positive-type resist (sensitivity: 222.6 mJ/cm$^2$). Conversely, PH-2 resist is a negative-type resist (sensitivity: 47.7 mJ/cm$^2$).

The positive and negative images developed with 220 and 47 mJ/cm$^2$ dosages, respectively, were evaluated by the adhesion test and found that neither the positive nor the negative images were stripped after the adhesion test. This advantage is attributed to the silicon proton on the phenyl group which provides good adhesion to the silicon wafer. In addition, the developed positive images of PH-1 were postbaked in a conventional oven at 220° C. for 30 min and found highly resistant to thermal deformation; the developed negative images of PH-2 were postbaked in a conventional oven at 300° C. for 30 min and found highly resistant to thermal deformation, wherein the patterns of the developed positive and negative images were not deformed by the post bake.

The oxygen plasma etching behavior of the resists prepared by α-PMTMMS, PMTMSS, and several other polymers was determined and shown in Table 1. The resists were prepared and developed as above, and then hard baked for 30 min. The oxygen plasma condition had an RF level power of 1300 W, and chamber pressure of 0.4 torr.

TABLE 1

| polymer | Slicon content wt % | Mw | Etching rate Å/min. | Etching selectivity |
| --- | --- | --- | --- | --- |
| α-PHTMMS | 7.4 | 48,000 | 70 | 1:6 |
| PHTMSS | 7.7 | 126,000 | 60 | 1:7 |
| α-PMTMMS | 9.8 | 37,800 | 40 | 1:10.5 |
| PMTMSS | 10.3 | 31,000 | 35 | 1:12 |
| HPR-204* | — | — | 420 | 1:1 |

*HPR-204 is a positive-type resist and available from HUNT Co., U.S.

It can be seen from the data in Table 1 that the etching selectivity 1:6 of α-PHTMMS containing 7.3 wt % silicon is increased to 1:12 of PMTMSS containing 10.3 wt % silicon. The etching selectivity of 1:12 good enough for PMTMSS to be used as a top imaging layer for transferring patterns to a bottom HPR-204 layer in a bilayer resist system.

What is claimed is:

1. A maleimide-alt-trialkylsilylstyrene copolymer having repeating units of:

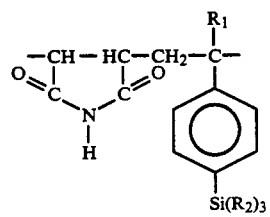

wherein:
$R_1$ is H or methyl group;
$R_2$ is $C_1$-$C_3$ alkyl group; and
said copolymer has a weight average molecular weight of 25,000–120,000.

2. The copolymer according to claim 1 wherein $R_2$ is methyl.

3. The copolymer according to claim 1 wherein the copolymer has a weight average molecular weight of 30,000–40,000.

4. The copolymer according to claim 3 wherein $R_2$ is methyl.

* * * * *